United States Patent [19]
James et al.

[11] Patent Number: 5,966,723
[45] Date of Patent: Oct. 12, 1999

[54] SERIAL PROGRAMMING MODE FOR NON-VOLATILE MEMORY

[75] Inventors: David B. James, Sacramento; Peter T. Larsen, Citrus Heights, both of Calif.

[73] Assignee: Intel Corporation, Santa Clara, Calif.

[21] Appl. No.: 08/857,795

[22] Filed: May 16, 1997

[51] Int. Cl.[6] .............................. G11C 16/00; G06F 9/06
[52] U.S. Cl. .............................. 711/103; 711/154; 712/37
[58] Field of Search ..................................... 711/103, 154; 395/834, 800.37; 365/185.33, 221

[56] References Cited

U.S. PATENT DOCUMENTS

| | | | |
|---|---|---|---|
| 5,179,716 | 1/1993 | Agrawal et al. | 395/800.38 |
| 5,261,116 | 11/1993 | Agrawal | 395/595 |
| 5,430,859 | 7/1995 | Norman et al. | 711/103 |
| 5,473,758 | 12/1995 | Allen et al. | 711/103 |
| 5,488,711 | 1/1996 | Hewitt et al. | 711/103 |
| 5,504,903 | 4/1996 | Chen et al. | 395/800.37 |
| 5,596,738 | 1/1997 | Pope | 711/103 |
| 5,734,868 | 3/1998 | Curd et al. | 395/800.37 |

OTHER PUBLICATIONS

"Interfacing the MC68HC705J1A to 9356/9366 EEPROMs", Mark Glenewinkel, Motorola Semiconductor Application Note, pp. 1–21, 1995.

"8–MBIOT (512K X 16, 1024K X 8) SmartVoltage Boot Block Flash Memory Family", Intel Product Review, pp. 1–55, Sep. 1995.

"28F016SA 16–IMBIT X 16, 2 MBIT X 8) FlashFile™ Memory", Intel Preliminary, pp. 1–52, Jul. 1995.

*Primary Examiner*—Eddie P. Chan
*Assistant Examiner*—Yamir Encarnacion
*Attorney, Agent, or Firm*—Blakely, Sokoloff, Taylor & Zafman LLP

[57] ABSTRACT

A method and apparatus for storing a value in a non-volatile memory device is disclosed. The non-volatile memory device includes a plurality of address pins for concurrently receiving the respective bits of an address value while the non-volatile memory device is in a parallel interface mode. In response to one or more signals, the non-volatile memory device is transitioned to a serial interface mode to enable a serial input. A sequence of bits is received in the non-volatile memory device via the serial input. The first portion of the sequence of bits represents a store command and a second portion of the sequence of bits represents a data value. The data value represented by the second portion of the sequence of bits is then stored in the non-volatile memory device in response to the store command represented by the first portion of the sequence of bits.

20 Claims, 9 Drawing Sheets

SERIAL PROGRAMMING MODE FOR NON-VOLATILE MEMORY

FIELD OF THE INVENTION

The present invention relates to the field of data storage. More particularly, this invention relates to a method and apparatus for communicating with a non-volatile memory device.

BACKGROUND OF THE INVENTION

Virtually all processor-controlled devices include a non-volatile memory device to hold a program called a boot program. The boot program contains the set of instructions executed by the processor on device power-up. In many consumer electronics devices, such as electronic pagers, cellular telephones, personal data organizers, home appliances, etc., the boot program constitutes the complete program for the device. In other more software-intensive devices, such as general purpose computer systems and more sophisticated consumer electronics items, the boot program is usually executed to load other, more extensive programs. In either case, some sort of boot program must be present for the processor-controlled device to function.

Storing the boot program in a non-volatile memory device is referred to as "programming the device" and is typically accomplished with an apparatus called a "device programmer". To program a non-volatile memory device, signal generation circuitry within the device programmer is coupled to the memory device's address, data and control pins. The signal generation circuitry then generates the sequence of address, data and control signals necessary to store a user-supplied boot program in the memory device, often starting at a user-specified address. After the non-volatile memory device has been programmed, it is soldered or socket-mounted to a circuit card along with a processor such as a microprocessor or microcontroller. The circuit card is then mounted in the end product.

To appreciate the overhead required to program a non-volatile memory device, it is helpful to consider the prior-art flash memory device 12 shown in FIG. 1. Flash memory device 12 has twenty four address inputs A23-0, sixteen data inputs D15-0, output enable OE#, write enable WE#, chip enable CE#, program voltage input Vpp, supply voltage input Vcc and reference voltage input GND. Flash memory device 12 also includes a flash memory array 9, device state machine 4, command register 7, data register 5, address register 6 and status register 3.

To store a data value in flash memory device 12, two or more successive write operations must typically be performed. In the first write operation, a program command is written to command register 7 indicating that a data value is to be stored in the flash memory array 9. In the second write operation, an address value and a data value are written to address register 6 and data register 5, respectively. The device state machine 4 then stores the data value from data register 5 in the flash memory array 9 at the address indicated by the address value in address register 6.

A device programmer must assert signals at the flash memory device's address, data and control inputs in a particular sequence in order to cause the flash memory device 12 to carry out the above-described write operations. Specifically, to write the program command to command register 7 as described above, the device programmer must assert sixteen distinct signals representing the program command at data inputs D15-0, and also assert chip enable CE# and write enable WE#. The program command then latched within command register 7 within a specified time, after which the chip enable signal CE# or the write enable signal WE# must be deasserted in preparation for writing the data and address value in the second of the two write operations. To write the data value and address value into data register 5 and address register 6, respectively, the device programmer must assert twenty four distinct signals representing the address value at address inputs A23-0, sixteen distinct signals representing the data value at data inputs D15-0 chip enable CE# and write enable WE#. Of course, the number of signals that must be asserted by the device programmer increases with the number of data and address pins of the flash memory device 12.

There are a number of disadvantages to the above-described technique for programming a non-volatile memory device. First, device programmers themselves are usually implemented by a programmed processor and consequently require a relatively long time to generate the address, data and control signals necessary to program each data value. For example, while modern flash memory devices are capable of storing a new data value every 6 microseconds, device programmers typically require 40 to 190 microseconds to complete the sequence of signal transitions necessary to program a byte or word. In other words, the bottleneck in device programming is the signal setup time required by the device programmer, not the flash memory device itself. Also, while there are machines capable of generating data, address and control signals at the maximum rate permitted by the memory device, such machines are typically used to simulate real-time testing environments and are too expensive to dedicate to device programming.

Another disadvantage of the above-described programming technique is that the large number of connections required between the memory device and the device programmer usually make it impractical to erase and re-program the device after it has been soldered to a circuit card. This significantly limits the ability to modify or upgrade a boot program after the programmed memory device has been installed in-circuit. Because device programmers are often too expensive to be provided to field personnel, even socketed, potentially removable memory devices are usually not field upgradable.

BRIEF SUMMARY OF THE INVENTION

A method is described for storing a value in a non-volatile memory device having a plurality of address pins for concurrently receiving the respective bits of an address value while the memory device is in a parallel interface mode. The memory device is transitioned to a serial interface mode in response to one or more input signals, a serial input being enabled in the serial interface mode. A sequence of bits is received in the memory device via the serial input. A first portion of the sequence of bits indicates a store command and a second portion of the sequence of bits indicates a value to be stored in the memory device. The value indicated by the second portion of the sequence of bits is stored in the memory device in response to the store command indicated by the first portion of the sequence of bits.

BRIEF DESCRIPTION OF THE DRAWING

The present invention is illustrated by way of example and not limitation in the figures of the accompanying drawing in which like references indicate similar elements and in which:

FIG. 5 is an exemplary sequence of bits asserted to program the flash memory device of FIG. 2.

DETAILED DESCRIPTION

A non-volatile memory device having a serial interface is described. Although the detailed description describes embodiments based on a flash memory device, the invention may be used in any non-volatile semiconductor memory, including, but not limited to EPROMs, EEPROMs and flash memories, and including technologies such as NOR, NAND, AND, DIvided bit-line NOR (DINOR) and Ferro-electric random access memory (FRAM).

A flash memory device according to a preferred embodiment of the present invention can be operated in either the conventional parallel interface mode or in a serial interface mode. In the serial interface mode a substantially reduced number of pins is required to write to and read from the flash memory device. In fact, during programming operations, a device programmer need only toggle signals at a clock input and a serial data input of the flash memory device. Consequently, when the flash memory device is placed in serial interface mode, an existing device programmer can program the flash memory device significantly faster than in the conventional, parallel interface mode. This means that a greater number of devices can be programmed per unit time, resulting in an overall increase in manufacturing throughput.

Once programmed, the device may be permanently operated in serial interface mode, transitioned to parallel interface mode for conventional parallel access, or transitioned between parallel interface mode and serial interface mode as needed.

Another consequence of the reduced number of pins required to program a flash memory device via the serial interface is that it becomes significantly easier to program the device after it has been installed on a circuit board. This increases the flexibility of the manufacturing process and makes it possible to upgrade the boot program after manufacture. Also, a simplified, potentially less expensive device programmer can be used to program the device. This makes field upgrades of boot programs stored in the non-volatile memories of electronic devices more practical.

Figure 1:
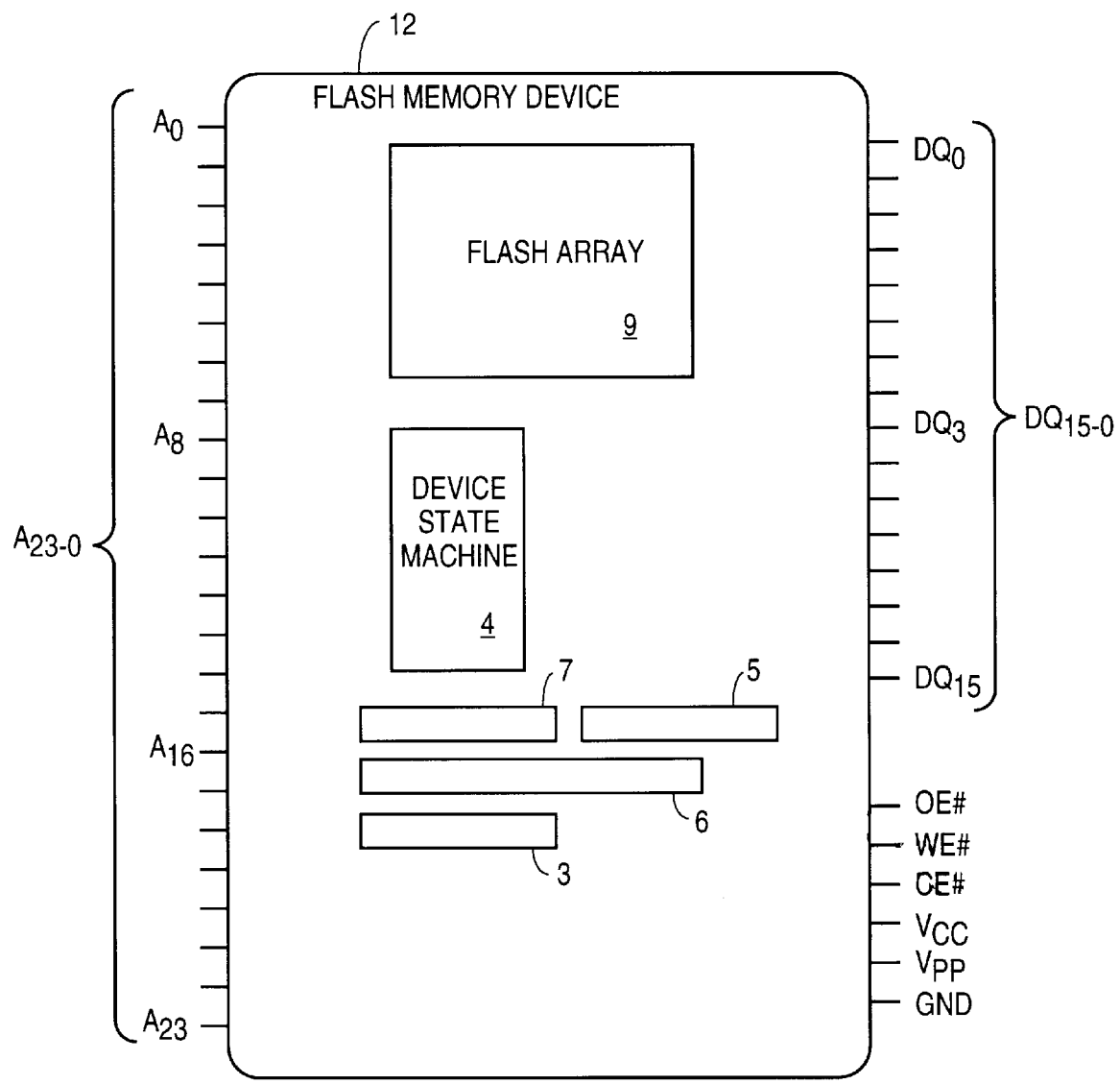
FIG. 1 is a diagram of a prior art flash memory architecture.
Figure 2:
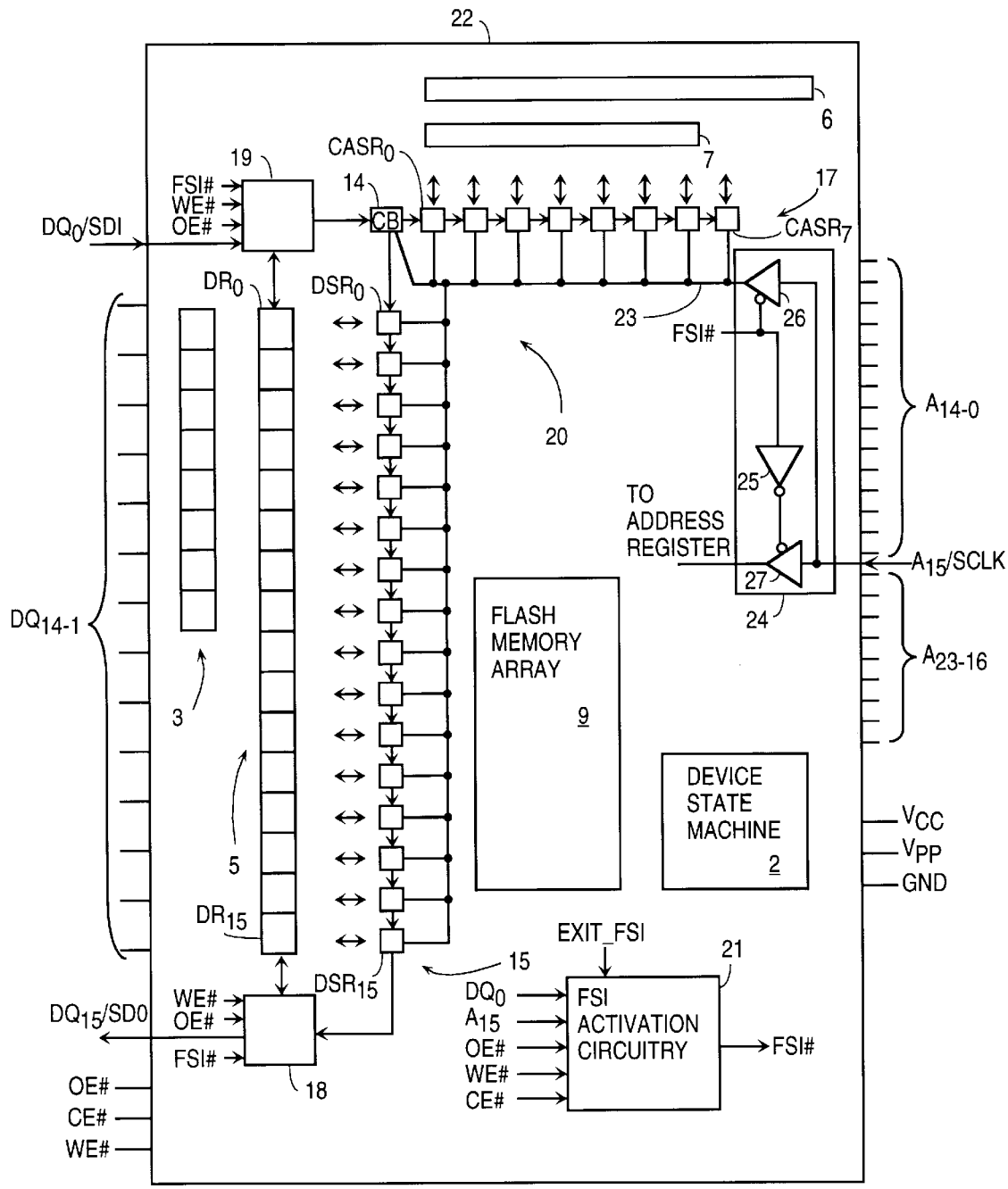
FIG. 2 is a diagram of a flash memory device that implements a preferred embodiment of the present invention.

FIG. 2 is a diagram of a flash memory device 22 that implements a preferred embodiment of the present invention. For the purpose of explaining the present invention, flash memory device 22 is assumed to have a 24-bit address width, a sixteen-bit data width and an eight bit command width. These device parameters may be changed without exceeding the scope or spirit of the present invention so that any data width or address width could alternatively be provided. For example, an eight-bit data width or a thirty-two bit address width could be provided.

Flash memory device 22 has the same set of pins discussed above in reference to prior-art flash memory device 12, and includes flash memory array 9, data register 5, status register 3, command register 7 and address register 6, each having essentially the same function as described above in reference to prior-art flash memory device 12. To support a serial interface mode, however, flash memory device 22 additionally includes input multiplexing circuit 19, shift register circuit 20, serial interface activation circuit 21, output multiplexing circuit 18, clock multiplexing circuit 24 and modified device state machine 2.

At initial power up, flash device 22 defaults to the traditional parallel interface mode. In the parallel interface mode, data pins DQ15-0 are used to write data and commands to the device and to read data and status information from the device. Address pins A23-0 are used to supply the address of each word to be written or read, and control signals OE#, WE# and CE# are used to signal specific read and write operations.

According to a preferred embodiment of the present invention, a serial interface mode of the device is activated by supplying a specific combination of signals at the DQ0, A15, OE#, WE# and CE# terminals of the flash memory device 22. The combination of signals required for serial interface activation is discussed further below, but for now it is sufficient that when the activating combination of signals is detected by the serial interface activation circuit 21, the activation circuit 21 asserts signal FSI# to place flash memory device 22 in serial interface mode. According to one embodiment of the present invention, once flash memory device 22 has been placed in serial interface mode, flash memory device 22 remains in serial interface mode until a specific command or signal protocol is issued to return flash memory device 22 to parallel interface mode. This way, once flash memory device 22 has been placed in serial interface mode, flash memory device 22 may be operated in serial interface mode indefinitely, even through subsequent power-down/power-up cycles.

When signal FSI# is asserted to input multiplexing circuit 19, a signal path between data pin DQ0 and control bit storage element 14 is enabled, and a signal path between data pin DQ0 and data register 5 bit DR0 is disabled. Consequently, in serial interface mode, data pin DQ0 serves as a serial data input SDI, while in parallel interface mode, data pin DQ0 serves as an input/output pin for parallel data bit zero. To indicate this dual function, data pin DQ0 is labeled DQ0/SDI in FIG. 2.

When signal FSI# is asserted to output multiplexing circuit 18, a signal path between data pin DQ15 and bit DSR15 of data shift register 15 is enabled, and a signal path between DQ15 and bit DR15 of data register 5 is disabled. Consequently, in serial interface mode, data pin DQ15 serves as a serial data output SDO, while in parallel mode, data pin DQ15 serves as an input/output pin for parallel data bit fifteen. To indicate this dual function, data pin DQ15 is labeled DQ15/SDO in FIG. 2.

Clock enable circuit 24 is coupled to address input A15 and also receives signal FSI#. When an active FSI# signal is received in clock enable circuit 24, buffer 26 is enabled to provide a signal path between address input A15 and clock signal line 23. The active FSI# signal is inverted by inverter 25 so that buffer 27 is disabled to tri-state the signal path between address input A15 and address register 6. Clock signal line 23 is coupled to a clock input of each of the shift register elements of the command/address shift register 17 and the data shift register 15, as well as to a clock input of control bit storage element 14. Thus, in serial interface mode, address pin A15 serves as a serial clock input SCLK to shift data from the DQ0/SDI input through either the command/address shift register 17 or the data register 15. Alternatively, in parallel interface mode, address pin A15 serves as one of the parallel address inputs A23-0. To indicate this dual function, pin A15 is labeled A15/SCLK in FIG. 2.

Once serial interface mode has been enabled by the serial interface activation circuit 21, data present at pin DQ0/SDI is shifted into a control bit storage element 14 at each rising edge of a clock signal supplied at pin A15/SCLK. This clock signal is referred to herein as the "serial clock". Also at each rising edge of the serial clock, the bit stored in the control bit storage element 14 is shifted into either command/ address shift register 17 or data shift register 15. Whether input bits are shifted to the command/address shift register 17 or data shift register 15 is determined by device state machine 2 based on a control bit shifted into control bit storage element 14. A control bit is a bit shifted into the control bit storage element 14 in the same shift operation that completes shifting a command or address into command/address shift register 17 or that completes shifting a data value into data shift register 15. In a preferred embodiment of the present invention, if the control bit is zero, then the next sixteen input bits are shifted into data shift register 15. If the control bit is nonzero, then the next eight input bits are shifted into command/address shift register 17.

In order to shift a data word into data shift register 15, seventeen shift operations are required. Similarly, to shift an eight-bit command or eight-bit portion of an address into command/address shift register, nine shift operations are required. This is because each of the bits must be shifted through control bit storage element 14. For example, a zero-valued control bit in control bit storage element 14 indicates that the next sixteen input bits are to be directed to the data shift register 15. However, each of the bits is first shifted through control bit storage element 14 so that, after the sixteenth rising edge of the serial clock, the least significant bit of the data value would be held in control bit storage element 14 and the most significant bit of the data value would be held in data shift register DSR14 (DSRn denotes the nth one of the bit storage elements of the data shift register, with DSR15 being the final storage element). Then, on the seventeenth rising edge of the serial clock, the least significant data bit is shifted out of control bit storage element 14 and into element DSR0 of data shift register 15, and a control bit is shifted into control bit storage element 14. The value of the control bit then determines the shift direction (command/address shift register 17 or data shift register 15) for the next sequence of input bits.

As stated above, the data present at data shift register 15 is driven out pin DQ15/SDO when flash memory device 22 is operated in serial interface mode. This provides a means for an attached device, such as a device programmer, to receive serial data from flash memory device 22. For example, to read a sixteen-bit value present in data shift register 15, a device programmer would simply assert a sequence of rising edges (low-to-high signal transitions) at pin A15/SCLK. Before the first rising edge, the most significant bit of the sixteen bit value held in data shift register 15 is asserted at output DQ15/SDO. After the first rising edge of the serial clock, the next most significant bit is asserted at output DQ15/SDO and so forth for each subsequent rising edge of the serial clock. As discussed below, by latching device status information into data shift register 15 at the rising edge of serial clock that begins a new data word, it becomes possible to shift out device status information at the same time that a new data word is shifted into the device. Further, when an IDLE command has been entered into command register 7, each new data word shifted into data shift register 15 causes the previously input word to be shifted out of the flash memory device at the DQ15/SDO output. This can be useful, for example, to confirm that a serial communication link between a device programmer and the flash memory device 22 is functioning properly.

Figure 3:
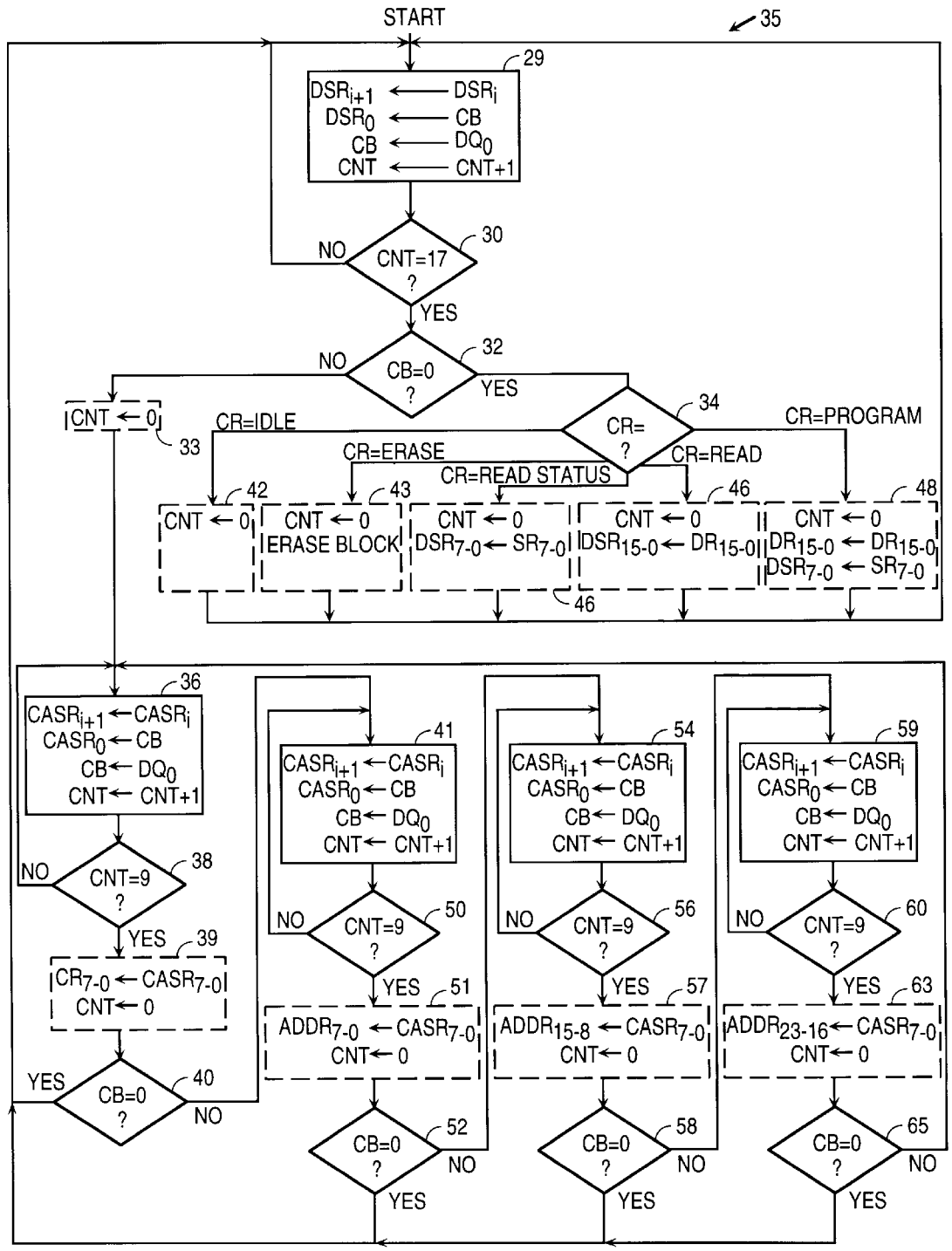
FIG. 3 is a state diagram illustrating the operation of the flash memory device of FIG. 2.

FIG. 3 is a state diagram 35 illustrating the operation of flash memory device 22 of FIG. 2 according to a preferred embodiment of the present invention. In the notation of FIG. 3, solid boxes 29, 36, 41, 54 and 59 represent states entered on a respective rising edge of the serial clock. These states are referred to herein as "rising-edge states". By contrast, dashed boxes 33, 39, 42, 43, 44, 46, 48, 51, 57 and 63 represent falling-edge states, each of which is entered, if at all, on a respective falling edge of the serial clock that follows receipt of a new control bit.

When the serial interface mode of the flash memory device according to FIG. 2 is first entered, the command in the command register 7 defaults to an IDLE command, address register 6 is cleared to zero and a counter within the device state machine (element 2 of FIG. 2), called a "bit counter", is cleared to zero. Then, at the first rising edge of the serial clock, data shift state 29 of FIG. 3 is entered. At the rising serial clock edge which marks entry to data shift state 29, the following operations are performed:

(1) The data bit present in each of the elements of the data shift register (element 15 of FIG. 2) is shifted to the next most significant element of the data shift register, with the most significant element of the data shift register being shifted out of the data shift register. This operation is indicated in element 29 of FIG. 3 as "$DSR_{i+1} \leftarrow DSR_i$";

(2) The bit in control bit storage element (element 14 of FIG. 2) is shifted into DSR0. This is indicated in element 29 as "DSR0←CB";

(3) The bit present at pin DQ0/SDI is shifted into the control bit storage element. This is indicated in element 29 as "CB←DQ0"; and (4) The bit counter is incremented. This is indicated in element 29 as "CNT←CNT+1".

After the data shift state 29 has been entered and the indicated operations performed, the bit counter and control bit are used to determine which state is entered on the next rising edge of the serial clock. At decision block 30, if the bit counter is not equal to seventeen, then a full data word has not yet been shifted into the data shift register. In that case, the data shift state 29 is re-entered and the indicated operations are repeated. If the bit counter is equal to seventeen, then sixteen data bits have been shifted into the data shift register (element 15 of FIG. 2) and a new control bit has been shifted into the control bit storage element (element 14 of FIG. 2). In that case, execution proceeds to decision block 32 where the value of the control bit is examined. If the control bit is zero, then the contents of the command register (element 7 of FIG. 2) are evaluated at step 34 to determine which command is to be executed. At the next rising edge of the serial clock after the indicated command has been executed, the data shift state 29 is re-entered. As indicated in FIG. 3, each of the different commands causes a respective one of the falling-edge states 42, 43, 44, 46 and 48 to be entered and the indicated operations to be performed. The operations performed upon entry to falling-edge states 42, 43, 44, 46 and 48 are discussed further below. However, regardless of which falling-edge state is entered, the value of the bit counter is cleared to zero and the data shift state 29 is entered on the succeeding rising edge of the serial clock to begin receipt of the next data word.

Returning to decision block 32, if the control bit is determined to be nonzero, then falling-edge state 33 is entered at the next falling edge of the serial clock to clear the bit counter. Then, at the subsequent rising edge of the serial clock, command shift state 36 is entered. The operations performed upon entry to the command shift state 36 are as follows:

(1) The bit present in each of the elements of the command/address shift register (element 17 of FIG. 2) is shifted to the next most significant element of the command/address shift register. This operation is indicated in element 36 of FIG. 3 as "$CASR_{i+1}$<–$CASR_i$";

(2) The bit in control bit storage element (element 14 of FIG. 2) is shifted into CASR0. This is indicated in element 36 as "CASR0<–CB";

(3) The bit present at pin DQ0/SDI is shifted into the control bit storage element. This is indicated in element 36 as "CB<–DQ0"; and (4) The bit counter is incremented. This is indicated in element 36 as "CNT<–CNT+1".

After entering the command shift state 36, the bit counter and control bit are evaluated to determine which state to enter at the next rising edge of the serial clock. If the bit counter is not equal to nine, a full command has not yet been shifted into the command/address shift register. In that case, the command state is re-entered and the indicated operations are repeated. If the bit counter is equal to nine, then a full command has been received in the command/address shift register and falling-edge state 39 is entered on the next falling edge of the serial clock. Upon entry to falling-edge state 39, the bit counter is cleared and the contents of the command/address shift register are transferred to the command register (element 7 of FIG. 2).

After entering falling-edge state 39 and performing the indicated operations, the control bit is evaluated to determine the state to be entered on the next rising edge of the serial clock. If the control bit is zero, then the data shift state 29 is entered to receive the next input data value. If the control bit is nonzero, then address zero state 41 is entered to receive the first byte of a multi-byte address. The operations performed in the address zero state 41 are the same as the operations performed in the command shift state 36. That is, the bit counter is incremented, each of the bits of the command/address shift register is shifted to the next most significant bit of the command/address shift register, the control bit is transferred from the control bit storage element to command/address shift register bit zero, and the data present at the DQ0/SDI pin is transferred to the control bit storage element. The address zero state 41 is also similar to the command shift state 36 in that it is iteratively re-entered until the bit counter reaches nine. This is indicated by decision block 50. However, at the falling edge of the serial clock after the bit counter reaches nine, instead of entering falling-edge state 39, falling edge state 51 is entered. Upon entry to falling-edge state 51, the bit counter is cleared and the contents of the command/address shift register are transferred to byte zero (bits 7-0) of the address register (element 6 of FIG. 2). After the contents of the command/address shift register are transferred and the bit counter cleared, the control bit is evaluated at decision block 52 to determine if another address byte is to be received. If the control bit is zero, then the starting address (e.g., of a program or read command) is fully specified by the address byte already received and the data shift state 29 is entered. If the control bit is nonzero, then address one state 54 is entered to receive the next eight bits of a starting address.

The operations performed upon entry to the address one state 54 are identical to operations performed upon entry to the address zero state 41, and the address one state is iteratively entered until the bit counter reaches nine. This is indicated by decision block 56. At the falling serial clock edge which follows the bit counter reaching nine, falling-edge state 57 is entered. Upon entry to falling-edge state 57, the bit counter is cleared and the contents of the command/address shift register are transferred to byte one (bits 15-8) of the address register. The control bit is then evaluated at decision block 58 to determine whether another address byte is to be received or if the starting address is now complete. If the control bit is zero, then the data shift state 29 is entered. If the control bit is nonzero, then the address two state is entered and reception of a third address byte is begun.

The operations performed upon entry to the address two state 59 are identical to the operations performed upon entry to the address zero state 41 and the address one state 54. Also, the address two state is iteratively entered until the bit counter reaches nine, as indicated by decision block 60. At the falling serial clock edge which follows the bit counter reaching nine, falling-edge state 63 is entered. Upon entry to falling-edge state 63, the bit counter is cleared and the contents of the command/address shift register are transferred to byte two (bits 23-16) of the address register. The control bit is then evaluated at decision block 65. If the control bit is zero, then the data shift state 29 is entered. If the control bit is nonzero, then the command shift state 36 is entered to receive a new command. It will be appreciated that an address of any length could be input by adding additional address byte reception states.

Returning to decision block 32, which is reached after the bit counter is incremented to seventeen in the data shift state 29, if the control bit is a logical zero, then the command contained in command register 7 is executed at the falling edge of the serial clock immediately following entry into data shift state 29. Thus, at decision block 34, one of the falling-edge states 42, 43, 44, 46, 48 is entered based on the command register 7 contents. If the command is an IDLE command, then the bit counter is cleared in falling-edge state 42. If the command is an ERASE command, one or more blocks of storage within the flash memory array (element 9 of FIG. 2) are erased in falling-edge state 43, and the bit counter is cleared. If the command is a READ-STATUS command, then the contents of the device status register (element 3 of FIG. 2) are periodically transferred to the data shift register during falling-edge state 44. Eventually, a rising serial clock edge is detected and the last transferred device status value is said to be "latched" in the data shift register. The latched device status bits will then be sequentially asserted at pin DQ15/SD0 upon iterative entry to data shift state 29. Depending on the bit-width of the device status register, less than the full number of data shift register storage elements receive status bits. In FIG. 3, for example, the notation "DSR7-0<–SR7-0" is used to indicate that eight status bits (7-0) are transferred to bits 7-0 of the data shift register.

Returning to decision block 34, if the command in the command register is a READ command, then the contents of the data register (element 5 of FIG. 2) are transferred to the data shift register in falling-edge state 46. The contents of the data shift register will then be sequentially asserted at pin DQ15/SD0 upon iterative entry to data shift state 29. Finally, if the command in the command register is a PROGRAM command, then falling-edge state 48 is entered. Upon entry to falling-edge state 48, the contents of the data shift register are transferred to the data register (element 5 of FIG. 2). Thereafter, the contents of the device status register are periodically transferred to the data shift register so that the device status can be latched as described above, and then shifted out during iterative entry to data shift state 29. In a preferred embodiment of the present invention, logic within device state machine 2 of the flash memory device 22 of FIG. 2 is designed to automatically increment the address at which a subsequently received data value is programmed. Automatic address incrementing may also be provided for successive read operations. It should be noted that the device commands described above are not intended to be an exhaustive list of commands that may be performed during a serial interface mode of the device, and that other device commands may also be performed.

Figure 4:
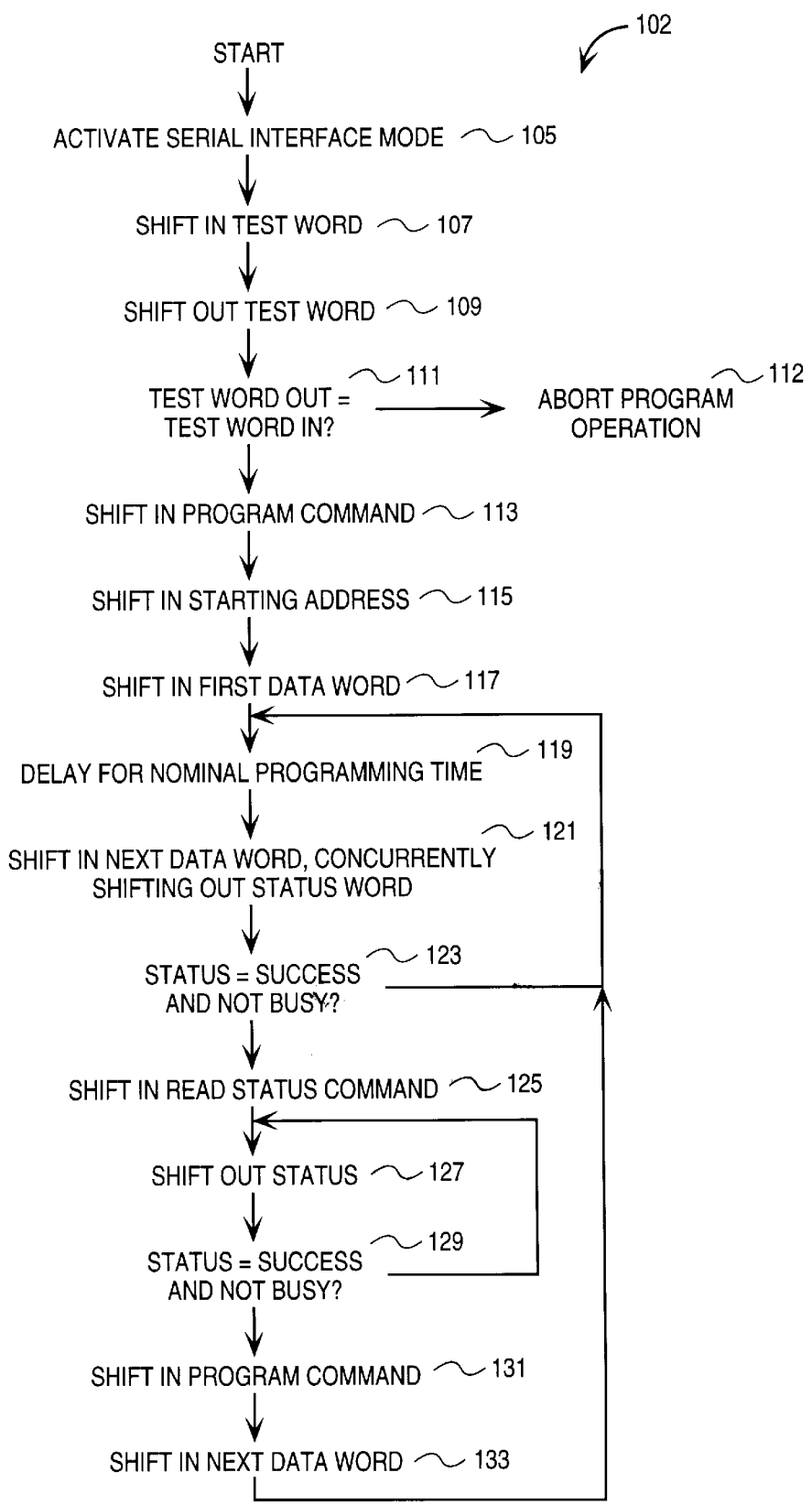
FIG. 4 is a flow diagram of a technique for programming the flash memory device of FIG. 2.

FIG. 4 is a flow diagram of one technique for programming a flash memory device having the architecture described in reference to FIG. 2 and operating according to the state diagram of FIG. 3. At step 105 of FIG. 4, the flash memory device is placed in serial interface mode. As stated above, according to a preferred embodiment of the present invention, the command in the flash memory device command register defaults to the IDLE command upon initial entry to serial interface mode. Consequently, after shifting a test word (a bit pattern) into the data shift register at step 107, the test word can be read out at DQ15/SDO by shifting in a subsequent stream of bits. This is indicated by step 109.

At step 111, the test word shifted out of the flash memory device at step 109 is compared to the test word shifted into the flash memory device at step 107. If the input test word is not equal to the output test word, something is wrong with the flash memory device, the device programmer or the connections between the two, and the program operation is aborted at step 112.

If the input and output test words match in step 111, then a PROGRAM command is shifted into the command/address shift register at step 113, followed by a starting address is shifted into the command/address shift register at step 115. As discussed above, the starting address is optional, so that if no starting address, or an incomplete starting address, is shifted into the command/address shift register at step 115, a zero-valued, or partially zero-valued, starting address is used.

At step 117, a first data word is shifted into the data shift register. A control bit follows each data word, and, because the command register now contains a PROGRAM command, the data word is transferred from the data shift register to the device data register at the falling edge of the serial clock which follows receipt of a zero-valued control bit. At step 119, a delay is introduced before shifting in a subsequent data word. The delay of step 119 is provided to give the flash memory device time to program the data word transferred from the data shift register to the data register in step 117. The delay is implemented simply by holding the serial clock signal low for a specified period of time (e.g., 6 microseconds) before transitioning the serial clock to generate the rising edge that begins the shift operation for the next data word. As discussed above in reference to FIG. 3, during the delay period, a device state machine within the flash memory device periodically transfers the status of the memory device from a device status register into the data shift register. This periodic status transfer continues until the next rising edge of the serial clock. At that point, no further status transfer occurs, so that the last-transferred status byte is considered to be "latched" in the data shift register at the rising edge of the serial clock.

At step 121, the next data word is shifted into the data shift register. As stated above, shifting a word into the data shift register not only supplies the next word to be programmed into the device, but also shifts out the device status corresponding to the word just programmed (in this case the first data word programmed during delay step 119). As discussed further below, the value of the control bit appended to the data word shifted into the flash memory device during step 121 is determined on the fly based upon the status of the device read out during that same step. This is possible because the status bits that indicate whether device is ready to program the next data value are received before the control bit is asserted to the input of the flash memory device. Thus, if at step 123, the status indicates that the previous data word was programmed successfully and that the flash memory device is not still busy, then a zero-valued control bit is shifted into the flash memory device causing the data word shifted into the data shift register in step 121 to be transferred to the data register for programming. In that case, execution loops back to step 119 to delay while the most recently transferred data word is programmed into the device. Then, step 121 is repeated to shift in the next data word and to shift out the status of the most recently initiated programming operation. Thus, the sequence of steps 119, 121, 123 are iteratively performed so long as the status evaluated at step 123 indicates that the device is ready for the next data word and that no errors were encountered in the attempt to program the previous data word.

If, at step 123, the status bits corresponding to the most recently initiated programming operation indicate that the flash memory device is still busy or that the program operation was unsuccessful, then the control bit appended to the data word shifted in at step 121 is a logical "1". This "on the fly" determination of the control bit is possible because there is some overlap between steps 119, 121 and 123. More specifically, in a preferred embodiment of the present invention, the bits of the device status relied upon to determine whether to proceed with the next data word are received prior to assertion of the control bit at the serial data input of the flash memory device. The logical "1" shifted into the control bit indicates that the next sequence of bits is to be shifted into the command/address shift register. Thus, at step 125, a READ STATUS command is shifted into the command/address shift register. Appended to the read status command is a zero-valued control bit to indicate that the next sequence of bits is to be shifted into the data shift register. Sixteen bits are then shifted into the data shift register and a seventeenth, zero-valued control bit is shifted into the control element. As discussed above in reference to FIG. 3, the READ STATUS command in the command register is executed at the falling edge of the serial clock after a data shift operation for which the ensuing control bit is zero. Thus, the zero-valued control bit causes the READ STATUS command to be executed. In response to the READ STATUS command, device status begins to be periodically transferred from the status register to the data shift register. Then, at the next rising edge of the serial clock, the status value is latched in the data shift register and is shifted out by shifting in a subsequent data word. It will be appreciated that the purpose of shifting data into the data shift register at this point is only to cause successive bits of the device status to appear at pin DQ15/SD0 and therefore the value of the input bit sequence is insignificant. If, at step 129, the device status continues to indicate that the device is not busy or that the previous write was unsuccessful, then step 127 is repeated to shift out another status word. This is possible because a new device status is latched before the rising edge that begins each new data word shift operation.

Eventually the device should complete the previous write operation and indicate that it is no longer busy (for a write failure, the programming operation may need to be terminated). If the previous write operation is detected to have been successfully completed, then a program command is shifted into the command/address shift register at step 131, followed by a zero-valued control bit to indicate that the next sequence of bits is to be a data word. Since the data word used to shift out the not-ready/not successful status in step 123 has not yet been programmed, that data word is shifted into the data shift register again at step 133. As discussed above, the device state machine within the flash memory device includes logic to prevent auto-incrementing the program address until a previously initiated program operation has been successfully completed. Consequently, the data word shifted in but not programmed in step 121 will be programmed at the correct address in step 133. After step 133, execution loops back to step 119 to delay for a nominal programming time.

The programming operation continues in the above-described manner until all of the data words have been programmed. When the last word to be programmed has been shifted into the data shift register (at step 133 or 121), a sequence of bits having insignificant value can be shifted into the data shift register to retrieve the final device status.

Figure 5:
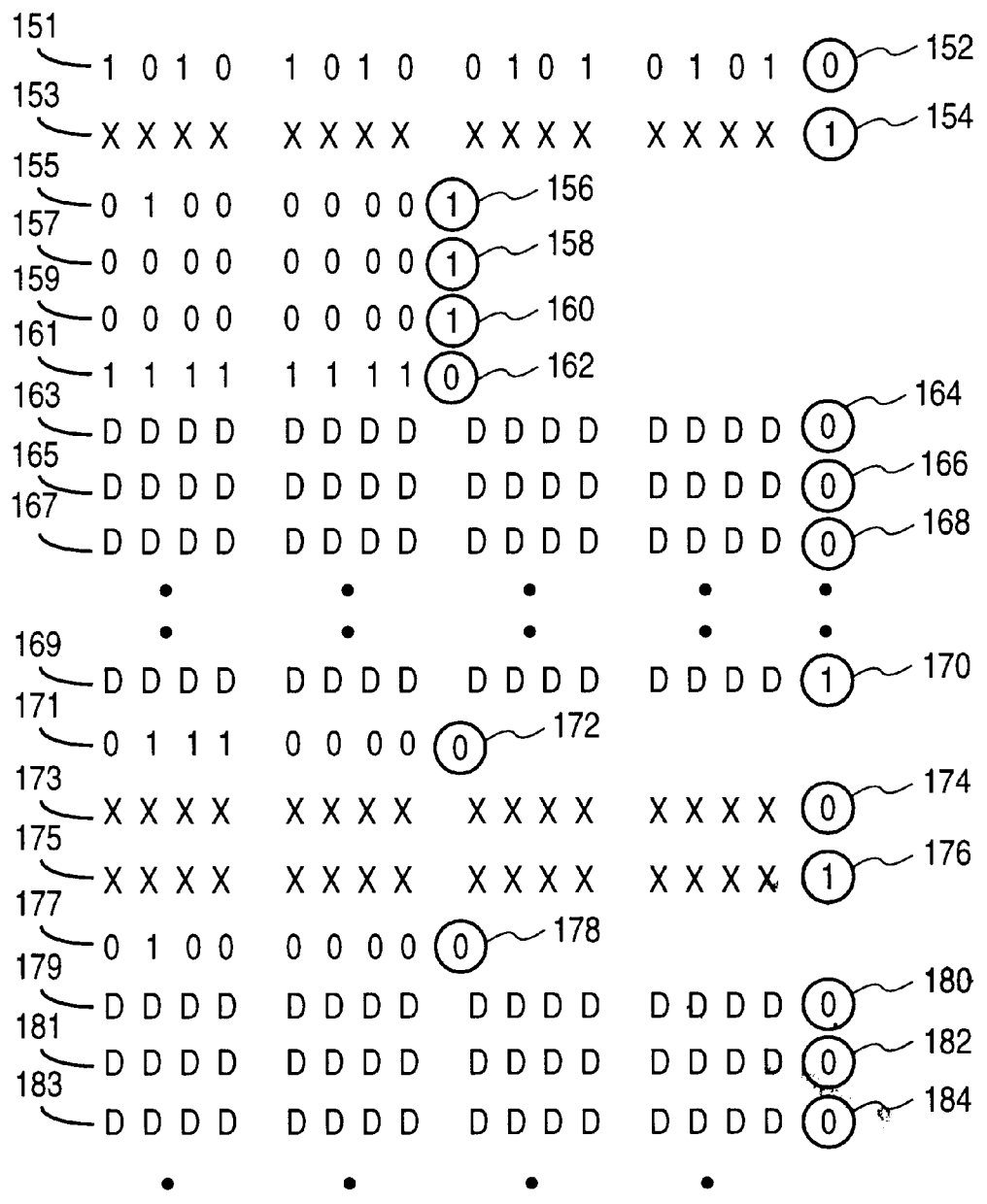

FIG. 5 shows an exemplary sequence of bits asserted at the DQ0/SDI pin of the flash memory device of FIG. 2 to cause the programming actions described above in reference to FIG. 4. Each of the indicated bits is shifted into the flash memory device on a rising edge of the serial clock.

Upon initial entry to serial interface mode, a test word is shifted into the flash memory device followed by a zero-valued control bit. This is shown by bit sequence 151 and control bit 152. Recall that the command register of the flash memory device initially contains an IDLE command so that the contents of the data shift register are unaltered upon receipt of control bit 152. Moreover, because control bit 152 is zero-valued, the sequence of bits 153 can be entered to shift out the test word (bits 151). Bit sequence 153 is depicted in FIG. 3 as "X"s to indicate that the value of the bits is insignificant.

The control bit 154 following bit sequence 153 is a "1" to cause the next sequence of bits 157 to be shifted into the command/address shift register. At this point, steps 105, 107 and 109 of flow diagram 102 (FIG. 4) have been completed, and the device is prepared to receive the program command as indicated by step 113 of flow diagram 102. Bit sequence 155 (40 hex) represents a program command according to one embodiment of the present invention. Bit sequence 155 is shifted into the command/address shift register and the control bit 156 is shifted into the control bit storage element. If control bit 156 is zero-valued, then a default, zero-valued address would be installed in the address register of the flash memory device. However, as shown in FIG. 5, control bit 156 is nonzero, indicating that one or more bytes of an address are to follow.

In this example, the starting address of the boot program being stored in the flash memory device is to be FF0000 hex. Consequently, bit sequence 157 (00 hex) is input to supply address byte zero and is followed by a nonzero control bit 158 to indicate that address byte one is to follow. Bit sequence 159 (00 hex) is input to supply address byte one and is followed by a nonzero control bit 160 to indicate that address byte two is to follow. Finally, bit sequence 161 (FF hex) is input to supply address byte two. Bit sequence 161 is followed by a zero-valued control bit to indicate that the next sequence of bits 163 is data to be programmed at the indicated starting address. Again referring to flow diagram 102 of FIG. 4, a PROGRAM command and starting address have now been shifted into the flash memory device as indicated by steps 113 and 115.

Returning to FIG. 5, bit sequence 163 is shifted into the data shift register and is followed by a zero-valued control bit 164 to indicate that more data is to follow. As discussed above in reference to FIG. 3, on the falling edge of the serial clock that follows shifting in control bit 164, bit sequence 163 is transferred from the data shift register to the data register to be programmed in the flash memory array at the address held in the address register. Also at the falling edge of the serial clock that follows shifting in control bit 164, the device state machine begins periodically transferring the contents of the device status register into the data shift register. Then, after a delay (as indicated by step 119 of FIG. 4), the serial clock is transitioned to generate the first rising edge used to shift in bit sequence 165. At that first rising edge, the contents of the device status register are no longer transferred to the data shift register so that the last status value transferred to the data shift register is shifted out of the flash memory device as bit sequence 165 is shifted into the data shift register. Bit sequence 165, like bit sequence 163 before and a number of bit sequences which follow, is shown as being a sequence of "D"s to indicate that it represents a data value to be programmed in the flash memory array. The data value can be a processor instruction (e.g., an opcode), operand, program constant or any other entity that can be represented by a plurality of bits.

Assuming that the status information shifted out when bit sequence 165 is shifted in does not indicate that the device is still busy programming bit sequence 163, and that the status information indicates that no error has been encountered while programming bit sequence 163, the control bit which follows bit sequence 165 is a zero to indicate that the next value to be shifted in is a data word. Thus, a sequence of words 163, 165, 167 and so forth, are shifted into the flash memory device and programmed at incremental addresses. A delay between the falling edge of the serial clock that succeeds shifting in a control bit (164, 166, 168, . . .) and the rising edge of the clock that begins the shift operation for the subsequent data word is used to provide time for the device to program the data word most recently input. Thus, assertion of bit sequences 165, 167 and their associated control bits 166 and 168 correspond to iteratively performing steps 119, 121 and 123 of flow diagram 102 (FIG. 4).

When bit sequence 169 is shifted in, the status value corresponding to the data word most recently transferred from the data shift register to the device data register is shifted out. In one embodiment of the present invention, bits 7 and 4 of the status word indicate whether the device is still busy and whether there has been a programming error, respectively. Consequently, it is possible to determine whether additional time is necessary to complete programming the previous data word before control bit 170 is shifted into the control bit storage element. Thus, the value of control bit 170, like control bits 166 and 168 before it is determined on the fly based on the status value shifted out for the preceding data word. Thus, if status bits seven and four indicate that the device is not busy and that no programming error has been encountered while programming the previous word, then a zero value control bit is supplied. However, if the device is not ready to program the data word indicated by bit sequence 169 or if there has been a failure programming the previous data word, then control bit 170 is set to a "1" to indicate that the next sequence of bits 171 represents a command. This latter condition is shown by control bit 170.

Referring to flow diagram 102 of FIG. 4, steps 123 and 125 correspond to the above described events. That is, the device status is determined to indicate that the device is busy or was unsuccessful programming the previous data word at step 123, and a READ STATUS command is shifted into the device at step 125.

Returning to FIG. 5, bit sequence 171 represents a READ STATUS command (70 hex) according to one embodiment of the present invention. Also, the READ STATUS command is followed by a zero-valued control bit 172 to indicate that the next sequence of bits 173 is to be shifted into the data shift register. The READ STATUS command is transferred to the device command register at the falling edge of the serial clock that follows receipt of control bit 172. As described above, in one embodiment of the present invention, the command in the command register is executed on the falling edge of the serial clock that succeeds receipt of a zero-valued control bit appended to a data shift operation (see decision block 32 of FIG. 3). Thus, the purpose of bit sequence 173 to allow a zero-valued control bit 174 to be shifted into the device. Then, at the falling edge of the serial clock that follows receipt of control bit 174, the READ STATUS command in the command register is executed to cause device status information to be periodically transferred to the data shift register. At the next rising edge of the serial clock that begins receipt of bit sequence 175, periodic transfer of the device status information into the data shift register stops, so that the most recently transferred status information is latched in the data shift register. Bit sequence 175 is then shifted into the data shift register to shift the device status information out of the device. If the status information indicates that the device is still not ready for the next data word, control bit 176 would be set to zero to cause execution of the READ STATUS command be repeated to obtain updated status information. This way, status information can be repeatedly polled until the device becomes ready or a decision is made to abort the programming operation. Note, in cases where the status information indicates an error of some sort, the program operation would typically be aborted.

If the status information does indicate that the device is ready to program a new data word, the ready status can be detected before the value of control bit 176 has been input so that control bit 176 can be determined on the fly to be a "1". Because control bit 176 is nonzero, the next sequence of bits 177 is shifted into the command/address shift register to supply a new command. This way, a new PROGRAM command can be entered to resume the programming operation. Thus, bit sequence 177 (40 hex) is shifted into the command/address shift register and a zero-valued control bit 178 is shifted into the control bit storage element to indicate that the next sequence of bits 179 is to be shifted into the data shift register. Assertion of bit sequences 171, 173, 175 and 177 and their corresponding control bits 172, 174, 176 and 178 correspond to steps 125, 127, 129 and 131 of flow diagram 102 of FIG. 4.

Because bit sequence 169 was never programmed, bit sequence 169 is repeated in bit sequence 179, this time followed by zero-valued control bit 180. The auto-incremented address counter maintained by the flash memory device's device state machine has now been incremented to point to the address to which the data value represented by bit sequence 169 would have been written. That is, bit sequence 179 is written to the address to which bit sequence 169 would have been written. When bit sequence 181 is shifted in to supply the next data word, the status information pertaining to programming bit sequence 179 is shifted out. If the device is ready to program bit sequence 181, then a zero-valued control bit 182 is supplied and bit sequence 183 and control bit 184 are shifted in to continue the programming operation. The sequence of bits asserted at the DQ0/SDI input of the flash memory device is continued in the above described manner until each user-supplied data word has been programmed into the device or the programming operation is aborted.

Figure 6:
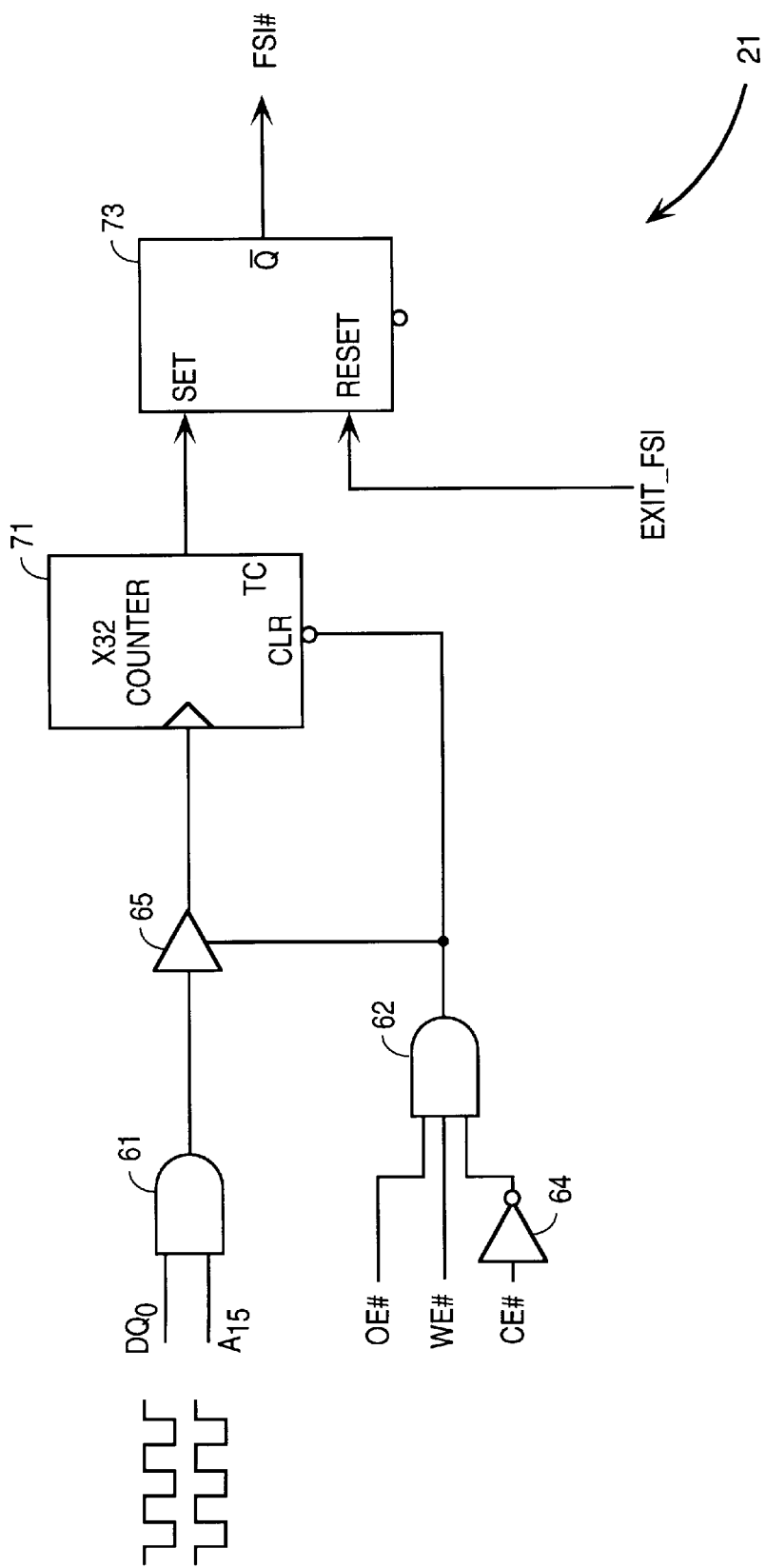
FIG. 6 depicts a serial interface activation circuit.

FIG. 6 depicts a preferred embodiment of the serial interface activation circuit 21 of FIG. 2. In order to activate the serial interface, output enable OE#, and write enable WE# are deasserted (raised to a logical high potential), chip enable CE# is asserted (dropped to a logical low potential), and then thirty-two synchronous pulses are applied to the DQ0 and A15 pins of the flash memory device.

Inverter 64 is used to invert the logical low chip enable CE# to a logical high signal so that when OE#, WE# and CE# are in the above-described state, a logical high potential is received at each of the three inputs of AND gate 62. AND gate 62 then outputs a logical high signal to the enable input of tri-state buffer 65 and to the clear input CLR of counter 71. Because counter 71 is cleared only when a logical low signal is asserted at its clear input CLR, counter 71 is not cleared so long as output enable OE# and write enable WE# are deasserted and chip enable CE# is asserted. The tri-state buffer is placed in a signal conducting state upon receipt of the logical high enable signal from AND gate 62, so that the output of AND gate 61 is asserted at the clock input of counter 71. Counter 71 is designed to output a terminal count signal TC upon detecting 32 rising edges at its clock input without receiving an intervening logical low signal at its clear input. Thus, when synchronous pulses are applied to inputs DQ0 and A15 of the flash memory device as shown, the pulses are output by AND gate 61 and received at the clock input of counter 71. After the rising edge of the thirty-second pair of synchronous pulses applied to device inputs DQ0 and A15, counter 71 asserts the terminal count signal TC. Terminal count signal TC is asserted at the SET input of set/reset latch 73 and causes latch 73 to be set. When set, latch 73 outputs the active-low serial interface enable signal FSI#.

As shown in FIG. 6, latch 73 may be reset by asserting an EXIT_FSI signal to the latch 73 RESET input. In a preferred embodiment of the present invention, the EXIT_FSI signal is generated when an EXIT command is received in the device command register. Thus, to exit serial interface mode, an EXIT command can be shifted into the command/address shift register. It will be appreciated that numerous other techniques for entering and exiting serial interface mode are possible and are considered within the spirit and scope of the present invention.

Figure 7:
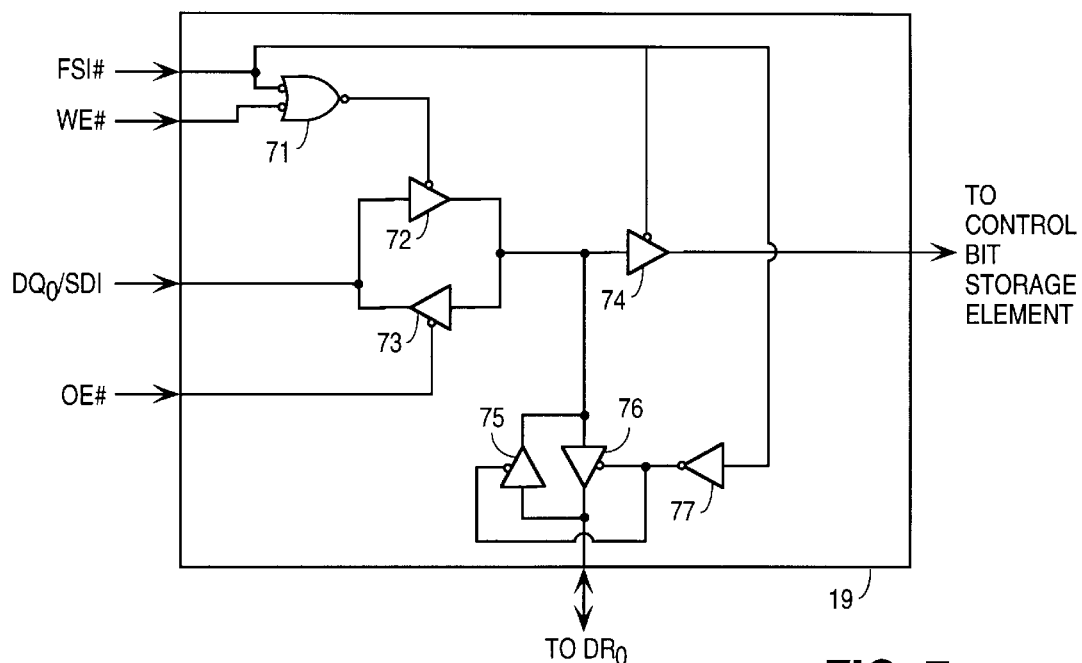
FIG. 7 depicts an input multiplexing circuit.

FIG. 7 depicts a preferred embodiment of the input multiplexing circuit 19 introduced in FIG. 2. The DQ0/SDI pin of the device is coupled to input buffer 72 and output buffer 73. Input buffer 72 is coupled to input buffer 74 and input buffer 76, and output buffer 73 is coupled to output buffer 75.

In parallel interface mode, FSI# is deasserted (raised to a logical high potential) so that input buffer 74 is disabled (placed in a tri-stated condition), and so that output buffer 75 and input buffer 76 are enabled. Inverter 77 is used to invert the level of FSI# so that when FSI# is at a logical high potential, a logical low potential is applied to the enable inputs of buffers 75 and 76 to enable the signal path between data register element DR0 and buffers 72 and 73. Thus, in parallel interface mode, asserting output enable OE# enables output buffer 73 to drive the contents of data register element DR0 out the DQ0/SDI pin. Similarly, when write enable WE# is asserted in parallel interface mode, logic gate 71 outputs a logical low signal to enable input buffer 72 to drive the signal present at DQ0/SDI to the input of buffer 76. Enabled buffer 76 then drives the signal present at the DQ0/SDI pin to the input of data register element DR0. Thus, in parallel interface mode, asserting signal WE# causes the signal present at pin DQ0/SDI to be asserted at the input of data register element DR0.

In serial interface mode, when FSI# is asserted, input buffer 74 is enabled and buffers 75 and 76 are disabled. Assertion of FSI# also causes logic gate 71 to assert a logic low signal to enable input buffer 72. Thus, in serial interface mode, the signal present at pin DQ0/SDI is passed through enabled buffers 72 and 74 to the input of the control bit storage element (element 14 of FIG. 2).

Figure 8:
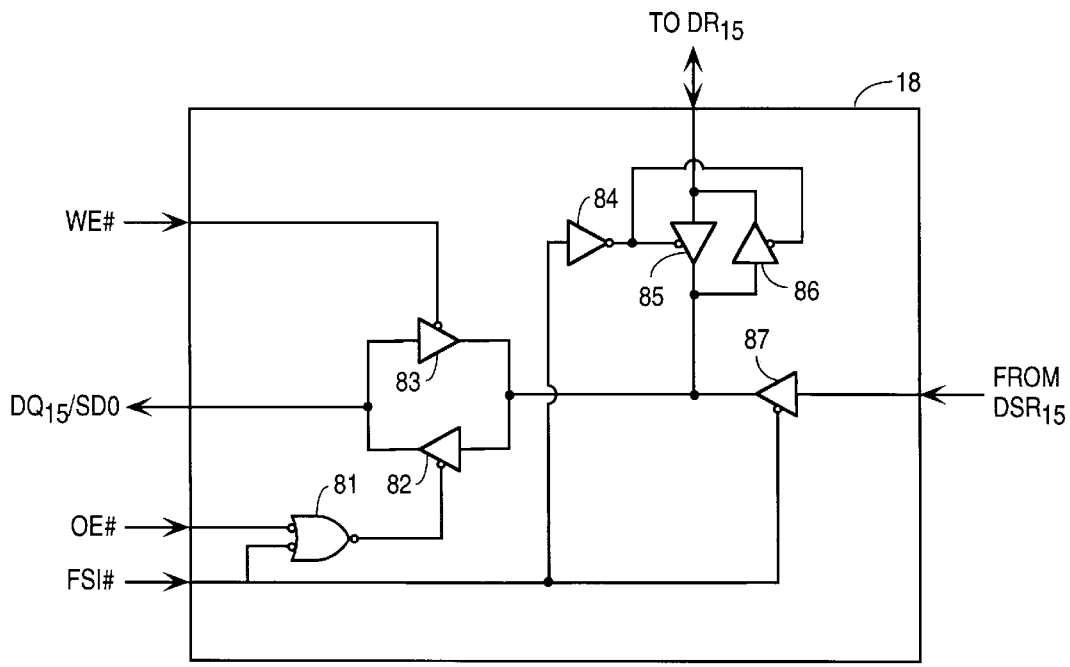
FIG. 8 depicts an output multiplexing circuit.

FIG. 8 depicts a preferred embodiment of the output multiplexing circuit 18 introduced in FIG. 2. The DQ15/SDO pin of the device is coupled to input buffer 83 and output buffer 82. Output buffer 82 is coupled to output buffer 85 and output buffer 87, and input buffer 83 is coupled to input buffer 86.

In parallel interface mode, FSI# is deasserted (raised to a logical high potential) so that output buffer 87 is disabled (placed in a tri-stated condition), and so that input buffer 86 and output buffer 85 are enabled. Inverter 84 is used to invert the level of FSI# so that when FSI# is at a logical high potential, a logical low potential is applied to the enable inputs of buffers 85 and 86 to enable the signal path between data register element DR15 and buffers 82 and 83. Thus, in parallel interface mode, the logical level of the bit in data register element DR15 is driven to the input of buffer 82 by enabled buffer 85, and, when OE# is asserted (dropped to a logical low potential), logic gate 81 outputs an active low signal to enable buffer 82 to drive the signal from buffer 85 onto the DQ15/SDO pin of the device. That is, when in parallel interface mode, asserting output enable OE# causes data register element DR15 to be driven out the DQ15 pin. Similarly, when write enable WE# is asserted in parallel interface mode, input buffer 83 is enabled to drive the signal present at pin DQ15/SDO to the input of buffer 86. Enabled buffer 86 then drives the signal present at the DQ15/SDO pin to the input of data register element DR15. Thus, in parallel interface mode, asserting signal WE# causes the signal present at pin DQ15 to be asserted at the input of data register element DR15.

In serial interface mode, when FSI# is asserted, output buffer 87 is enabled and buffers 85 and 86 are disabled. Also, assertion of FSI# causes logic gate 81 to assert a logic low signal to enable output buffer 82. Thus, in serial interface mode the value of the bit held in data shift register element data shift register bit 15 is passed through enabled buffers 87 and 82 to the drive an output signal at pin DQ15/SDO of the flash memory device.

Figure 9:
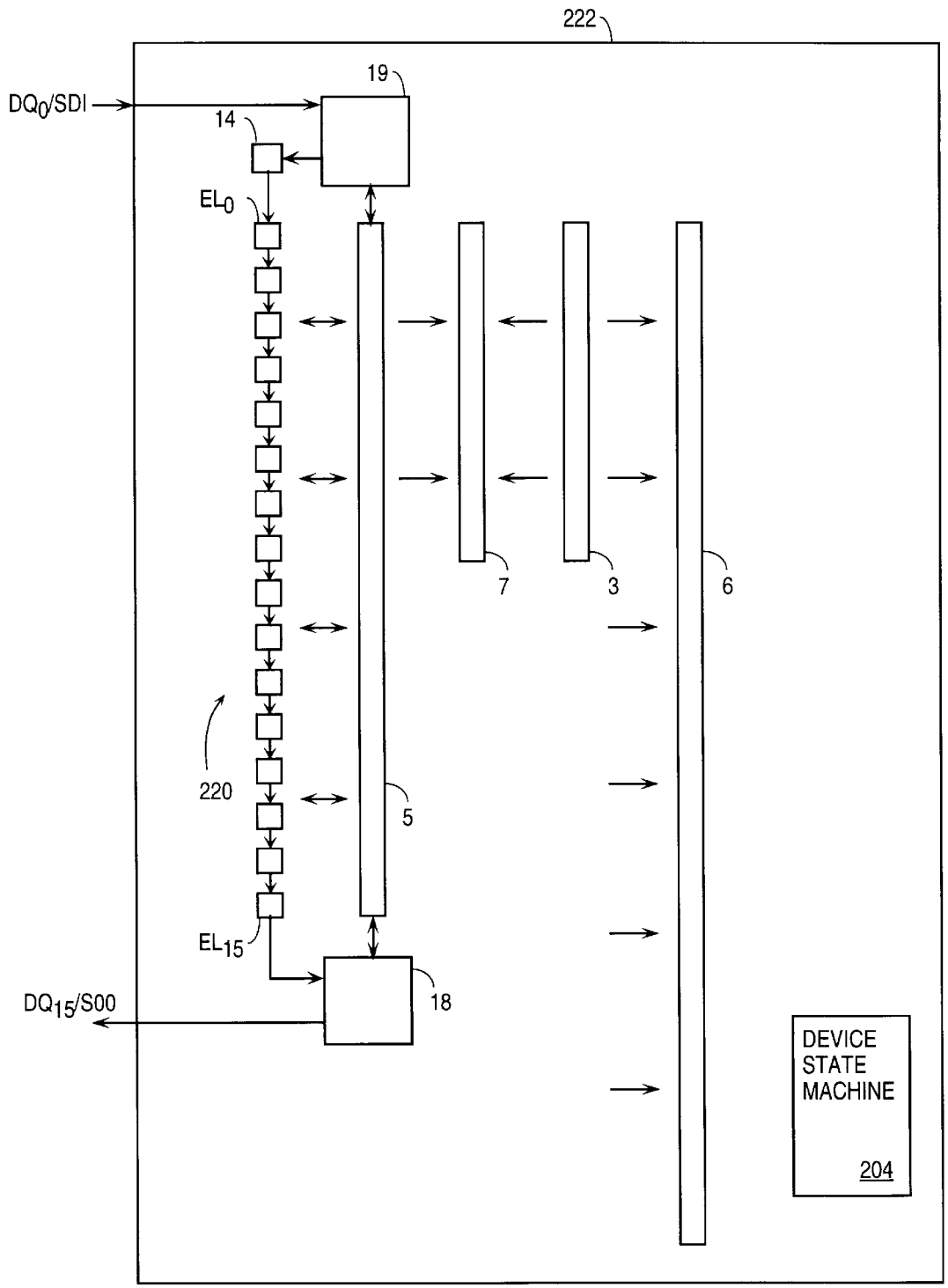
FIG. 9 is a diagram of a flash memory device that implements an alternate embodiment of the present invention.

FIG. 9 is an architecture diagram of a flash memory device 222 according to an alternate embodiment of the present invention. Flash memory device 222 includes a data register 5, command register 7, status register 3 and address register 6, input multiplexer 19 and output multiplexer 18, all serving the purpose described above in reference to FIG. 2 and FIG. 3. Though not shown in FIG. 9, flash memory device 222 also includes a flash memory array, serial interface activation circuitry, clock enabling circuitry, parallel address inputs A23-0, data inputs DQ14-1 (data inputs DQ0 and DQ15 are shown in FIG. 9), output enable OE#, chip enable CE#, write enable WE#, power input Vcc, program voltage input Vpp and reference voltage input GND, all serving the purpose described above. Flash memory device also includes a device state machine 204 and a shift circuit 220.

Flash memory device 222 differs from flash memory device 20 of FIG. 2 in the architecture of shift circuit 220 and the manner in which the device state machine 204 transfers data between shift circuit 220 and the various device registers. Shift circuit 220 differs from the shift circuit 20 described in reference to FIG. 2 in that separate data and command shift registers are not provided. Instead, all input data is shifted through control bit storage element 14 and into storage elements EL15-0 of shift circuit 220. Then, when a control bit is shifted into control bit storage element 14, device state machine 204 causes the contents of shift circuit 220 storage elements EL15-0 to be transferred to the appropriate register based on the preceding control bit value. For example, if a zero-valued control bit precedes a sequence of input bits and a PROGRAM command has been previously transferred to command register 7, then after the sequence of input bits has been shifted into storage elements EL15-0, the contents of the storage elements EL15-0 are transferred to data register 5 to be programmed. When a non-zero control bit succeeds a zero-valued control bit, then the ensuing sequence of bits which are shifted into shift circuit 220 storage elements EL7-0 are transferred to the command register 7. If the next control bit is another nonzero value, the next sequence of bits is shifted into the address register 6. Finally, the contents of status register 3 can be transferred to shift circuit 220 storage elements EL7-0 and shifted out at pin DQ15/SDO as discussed above. Thus, by providing a modified shift circuit 220 and modified logic within device state machine 204, the functionality of the flash memory device described in reference to FIG. 2 and FIG. 3 above is achieved in flash memory device 222 having a reduced number of shift circuit storage elements.

Figure 10:
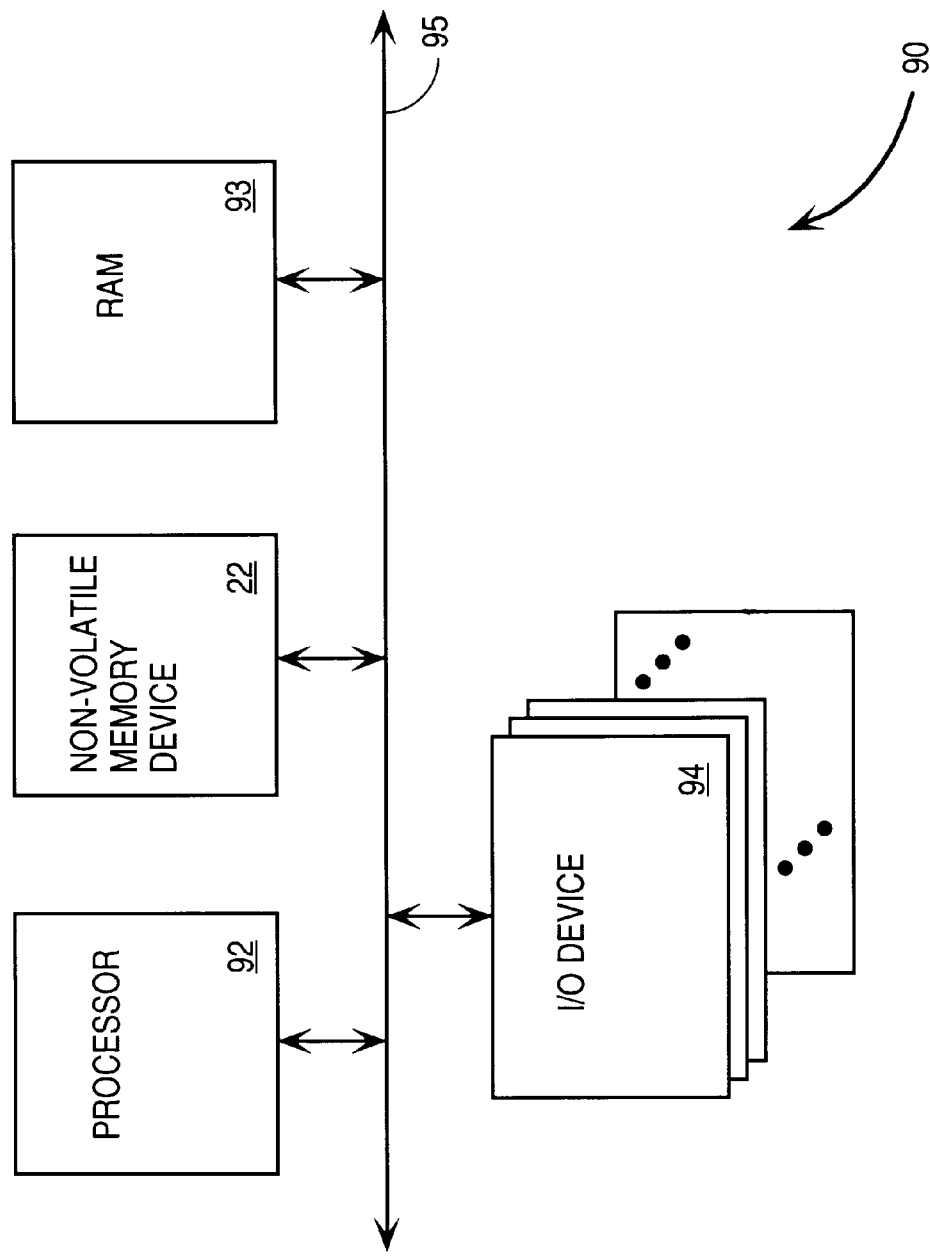
FIG. 10 is a block diagram of an apparatus including a non-volatile memory device, the non-volatile memory being in accordance with an embodiment of the present invention.

FIG. 10 is a block diagram of an apparatus 90 including the non-volatile memory device 22 described above in reference to FIG. 2, processor 92, random-access memory (RAM) 93 and I/O device 94 each coupled to bus 95. Apparatus 90 may be a computer system, electronic pager, camera, telephone, data recording instrument, or any other device in which processor-accessible non-volatile storage is required. In the case of a computer system, processor 92 may be a microprocessor and I/O device 94 may include a keyboard, mouse or other cursor control device, mass storage device, core memory, and display. In the case of a telephone, processor 92 may be a microcontroller and I/O device 94 may include a keypad, speaker, microphone, and signal generation and reception circuitry. In FIG. 10, I/O device 94 is depicted as a plurality of devices to indicate that the number and type of I/O devices connected to bus 95 may differ from application to application.

Bus 95 typically includes an address bus, data bus and control bus, and, in a preferred embodiment of the present invention, the control bus includes respective conductors for output enable OE#, write enable WE# and chip enable CE# as required by the non-volatile memory device 22.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly to be regarded in an illustrative rather than a restrictive sense.

What is claimed is:

1. A method for storing a value in a non-volatile memory device having a plurality of address pins for concurrently receiving the respective bits of an address value while the memory device is in a parallel interface mode, said method comprising:

transitioning the memory device to a serial interface mode in response to one or more input signals, a serial input being enabled in the serial interface mode;

receiving a sequence of bits in the memory device via the serial input, the sequence of bits comprising a first control bit and a second control bit, the first control bit having a first state indicating that a first portion of the sequence of bits represents a store command and the second control bit having a second state indicating that a second portion of the sequence of bits represents a value to be stored in the memory device; and storing in the memory device the second portion of the sequence of bits in response to the store command.

2. The method of claim 1 wherein receiving the sequence of bits comprises shifting the second portion of the sequence of bits into a data shift register in response to a clock signal, the data shift register having an input coupled to receive the second portion of the sequence of bits and an output coupled to a serial output of the memory device.

3. The method of claim 2 wherein shifting the second portion of the sequence of bits into the data shift register comprises shifting a plurality of status bits out of the data shift register, each status bit of the plurality of status bits being asserted at the serial output during a respective cycle of the clock signal.

4. The method of claim 2 wherein storing the second portion of the sequence of bits comprises transferring the second portion of the sequence of bits from the data shift register to a data register in response to a first transition of a clock signal.

5. The method of claim 4 further comprising transferring a plurality of status bits into the data shift register after said step of transferring the second portion of the sequence of bits to the data register.

6. The method of claim 5 wherein transferring the plurality of bits into the data shift register is repeatedly performed until a second transition of the clock signal is detected, the second transition of the clock signal being subsequent to the first transition of the clock signal.

7. The method of claim 1 wherein transitioning the memory device to a serial interface mode comprises enabling an input buffer coupled to the serial input.

8. The method of claim 1 further comprising transferring the first portion of the sequence of bits into a command register in response to a transition of a clock signal.

9. The method of claim 1 wherein storing comprises storing the second portion at an address in the memory device indicated by a third portion of the sequence of bits.

10. The method of claim 9 wherein the address is automatically incremented by logic within the memory device in response to successfully storing the value.

11. The method of claim 1 wherein receiving the sequence of bits in the memory device comprises receiving a first control bit in the sequence of bits indicating that the first portion of the sequence of bits is a command to be transferred to a command register.

12. A method for programming a non-volatile memory device, said method comprising:

asserting a clock signal at a clock input of the memory device;

asserting at a serial input of the memory device a first sequence of bits, each bit of the first sequence of bits being clocked into the memory device at a respective transition of the clock signal;

asserting at the serial input of the memory device a second sequence of bits, each bit of the second sequence of bits being clocked into the memory device at a respective transition of the clock signal; and asserting at the serial input of the memory device a first control bit and a second control bit, the first control bit having a first state indicating that the first sequence of bits represents a store command, the second control bit having a second state indicating that the second sequence of bits represents a value to be stored in the memory device, the first and second control bits being clocked into the memory device at a respective transition of the clock signal.

13. The method of claim 12 wherein asserting the first control bit and the second control bit precedes asserting the second sequence of bits.

14. The method of claim 12 wherein the first control bit is asserted before the assertion of the first sequence of bits and the first sequence of bits is shifted into a command shift register in response to the first control bit having the first state.

15. The method of claim 12 further comprising asserting at the serial input of the memory device a third sequence of bits representing an address in the memory device at which the value is to be stored.

16. A non-volatile semiconductor memory device comprising:

a plurality of data pins to receive the respective conductors of a parallel data bus;

a mode activation circuit to activate a serial input of said memory device in response to a request to enter a serial interface mode;

a clock input to receive a clock signal; and a shift register circuit to receive a sequence of bits via the serial input, each bit of the sequence of bits being received in the memory device at a respective transition of the clock signal, the sequence of bits including a plurality of control bits, each control bit indicating whether a respective portion of the sequence of bits is a device control value or a data value.

17. The memory device of claim 16 wherein the shift register circuit comprises:

a control bit storage element for receiving each of the plurality of control bits;

a data shift register to receive each portion of the sequence of bits indicated by a respective one of the plurality of control bits to be a data value; and a command shift register to receive each portion of the sequence of bits indicated by a respective one of the plurality of control bits to be a device control value.

18. The memory device of claim 16 further comprising:

a command register to receive from the shift register circuit a first portion of the sequence of bits indicated by a respective one of the plurality of control bits to be a device control value;

an address register to receive from the shift register circuit a second portion of the sequence of bits indicated by a respective one of the plurality of control bits to be a device control value; and a data register to receive from the shift register circuit each portion of the sequence of bits indicated by a respective one of the plurality of control bits to be a data value.

19. An apparatus comprising:

a bus including a plurality of address conductors;

a processor coupled to said bus; and a non-volatile memory device coupled to said bus, said memory device including:

a plurality of address pins to receive the respective conductors of the plurality of address conductors;

a mode activation circuit to activate a serial input of said memory device in response to a request to enter a serial interface mode;

a clock input to receive a clock signal; and a shift register circuit to receive a sequence of bits via the serial input, each bit of the sequence of bits being received in the memory device at a respective transition of the clock signal, the sequence of bits including a plurality of control bits, each control bit indicating whether a respective portion of the sequence of bits is a device control value or a data value.

20. The apparatus of claim 19 wherein the shift register circuit comprises:

a control bit storage element for receiving each of the plurality of control bits;

a data shift register to receive each portion of the sequence of bits indicated by a respective one of the plurality of control bits to be a data value; and a command shift register to receive each portion of the sequence of bits indicated by a respective one of the plurality of control bits to be a device control value.

* * * * *

UNITED STATES PATENT AND TRADEMARK OFFICE
CERTIFICATE OF CORRECTION

PATENT NO.     : 5,966,723
DATED          : October 12, 1999
INVENTOR(S)    : James et al.

It is certified that error appears in the above-identified patent and that said Letters Patent is hereby corrected as shown below:

Column 8,
Line 59, delete "DQ15/SD0", insert -- DQ15/SDO --.

Column 9,
Line 4, delete "DQ15/SD0", insert -- DQ15/SDO --.

Column 11,
Line 2, delete "DQ15/SD0", insert -- DQ15/SDO --.

Signed and Sealed this

Fifteenth Day of July, 2003

JAMES E. ROGAN
*Director of the United States Patent and Trademark Office*